(12) United States Patent
Nakata et al.

(10) Patent No.: US 6,664,817 B2
(45) Date of Patent: Dec. 16, 2003

(54) ZERO-CROSS DETECTION CIRCUIT (75) Inventors: Yasuhiro Nakata, Shizuoka (JP); Noriyuki Ito, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/323,925

(22) Filed: Dec. 20, 2002

(65) Prior Publication Data
US 2003/0122591 A1 Jul. 3, 2003

(30) Foreign Application Priority Data
Dec. 28, 2001 (JP) ........................ 2001/400778

(51) Int. Cl.[7] .............. H03K 5/32; H03B 5/36
(52) U.S. Cl. ............. 327/79; 363/89; 327/451
(58) Field of Search ............. 327/79, 78, 50, 327/417, 451; 363/24, 40, 133, 89; 323/222, 300, 301

(56) References Cited

U.S. PATENT DOCUMENTS 5,347,420 A * 9/1994 Fowler ................ 361/155
6,567,281 B2 * 5/2003 Riggio et al. ............ 363/24

* cited by examiner

Primary Examiner—Dinh Thanh Le
(74) Attorney, Agent, or Firm—Fitzpatrick, Cella, Harper & Scinto

(57) ABSTRACT

In a power supply device including a full-wave rectifying and smoothing circuit powered from a commercial AC power supply via two power supply lines, a switching regulator for separating and stepping down the output from the full-wave rectifying and smoothing circuit to output a desired DC voltage, and two capacitors after the full-wave rectifying and smoothing circuit for the terminal noise suppression purpose, a zero-cross detection circuit includes a transistor of which the emitter is connected to the low-voltage output terminal of the full-wave rectifying and smoothing circuit for outputting a zero-cross detection signal from the collector; a first resistor is connected between the base and emitter of the transistor; a second resistor is connected between one of the power supply lines and the base of the transistor; and a third resistor is connected between the other power supply line and the emitter of the transistor.

6 Claims, 9 Drawing Sheets

ZERO-CROSS DETECTION CIRCUIT

BACKGROUND OF THE INVENTION

1. Field of the Invention

The present invention relates to a zero-cross detection circuit for detecting a point at which an input alternating-current (AC) voltage crosses a predetermined voltage (0 V). More particularly, the present invention relates to a zero-cross detection circuit which is connected to a full-wave rectifying and smoothing circuit powered from a commercial AC power supply for full-wave rectification and smoothing, and which is also connected to a switching regulator for separating and stepping down the output from the full-wave rectifying and smoothing circuit to output a desired DC voltage.

2. Description of the Related Art

Figure 10:
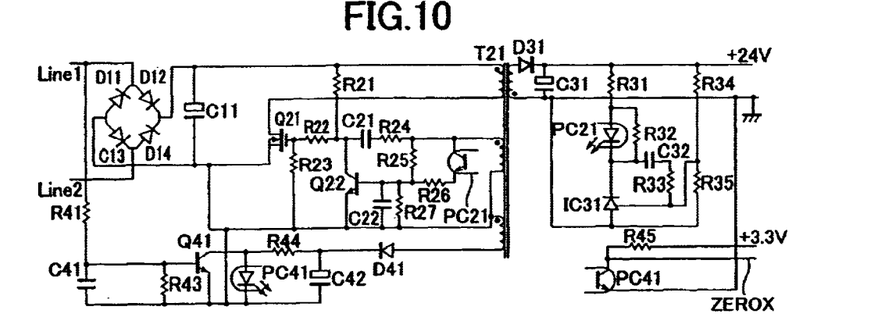
FIG. 10 is a circuit diagram of a power supply device using a commercial AC power input, showing a zero-cross detection circuit in the related art, and a rectifying and smoothing circuit and a switching regulator which are connected to the zero-cross detection circuit.

FIG. 10 is a circuit diagram of a power supply circuit using a commercial AC power input, in particular, showing a zero-cross detection circuit in the related art for detecting a point at which an input AC voltage crosses zero volts, and a rectifying and smoothing circuit and a switching regulator which are connected to the zero-cross detection circuit.

In FIG. 10, lines Line1 and Line2 are connected to a commercial AC power supply through a filter circuit (not shown). The full-wave rectifying and smoothing circuit is formed of diodes D11, D12, D13, and D14, and a smoothing capacitor C11.

In FIG. 10, the switching regulator which is the self-excitation type is formed of components indicated by Q21, Q22, C21, C22, C31, C32, D31, IC31, R21 to R27, R31 to R35, and PC21. The switching regulator is insulated by a transformer T21, and generates a constant voltage of +24 V.

The zero-cross detection circuit is formed of components indicated by Q41, C41, C42, D41, R41, R43, R44, R45, and PC41. In the zero-cross detection circuit, a low-voltage output terminal of the full-wave rectifying and smoothing circuit is connected to the emitter of the n-p-n transistor Q41, and the resistor R43 is connected between the base and emitter of the transistor Q41. The resistor R43 and the capacitor C41 are connected in parallel with each other, and the resistor R41 is connected between the capacitor C41 and the line Line1.

A half-wave rectifying circuit is formed of the resistors R41 and R43 in the zero-cross detection circuit, and the diode D13, and the output of the half-wave rectifying circuit is applied between the base and emitter of the transistor Q41. If the potential of the line Line1 is higher than the potential of the line Line2, a current flows in the resistor R41; otherwise, no current flows in the resistor R41. The resistances of the resistors R41 and R43 are set to suitable values so that the collector potential in the transistor Q41 can substantially change according to the potential magnitude of the lines Line1 and Line2. The high/low edges of the collector potential in the transistor Q41 correspond to zero crossings, and a zero-cross signal ZEROX is transmitted to the secondary of the transformer T21 via the photocoupler PC41. The capacitor C41 is a capacitor for removing noise, and is not essential to the zero-cross detection circuit.

FIGS. 11A to 11C and 12A to 12C are signal waveforms of the components in the zero-cross detection circuit.

Figure 11A:
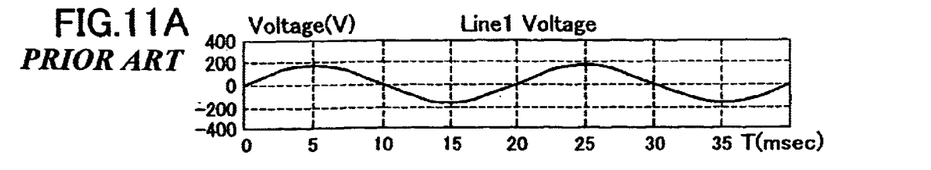
FIGS. 11A to 11C are waveforms of a normal AC power supply.
Figure 11B:
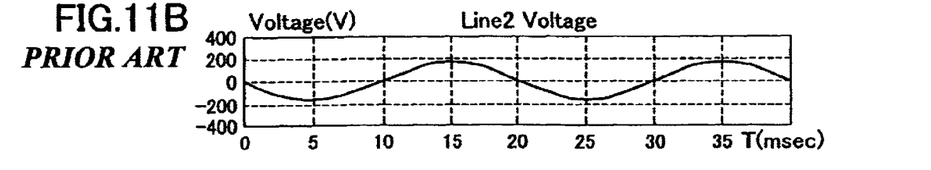
Figure 11C:
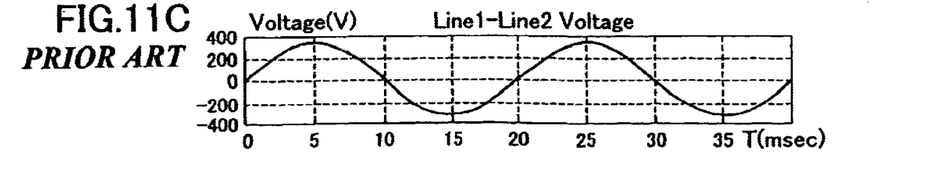
Figure 12A:
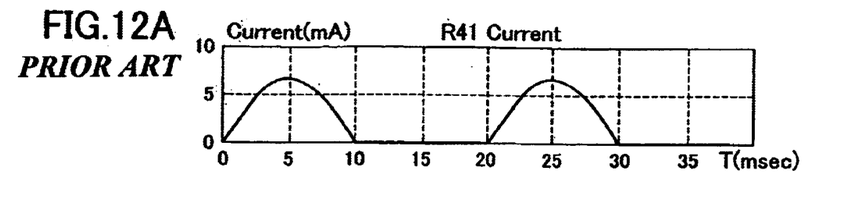
FIGS. 12A to 12C are signal waveforms of the components in the zero-cross detection circuit shown in FIG. 10.
Figure 12B:
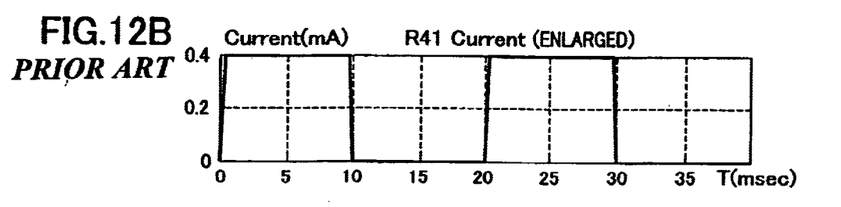
Figure 12C:
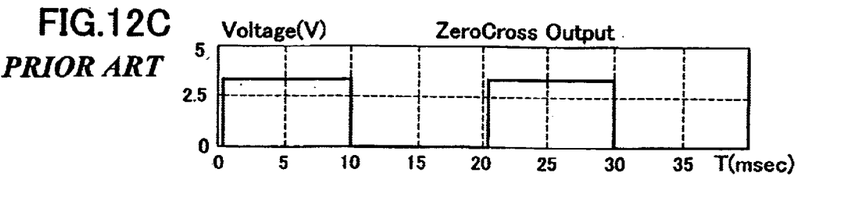

In FIGS. 11A to 11C and 12A to 12C, the x-axis represents time. FIG. 11A shows the potential of the line Line1 with respect to a ground GND, FIG. 11B shows the potential of the line Line2 with respect to the ground GND, and FIG. 11C shows the difference in potential between the lines Line1 and Line2. FIG. 12A shows a current flowing in the resistor R41, FIG. 12B shows an enlarged version of the y-axis in FIG. 12A, and FIG. 12C shows the phototransistor collector potential in the secondary of the photocoupler PC41, that is, the zero-cross signal ZEROX. In the secondary of the transformer T21, the voltage is stepped down from the output (+24 V) of the switching regulator to +3.3 V.

Figure 13:
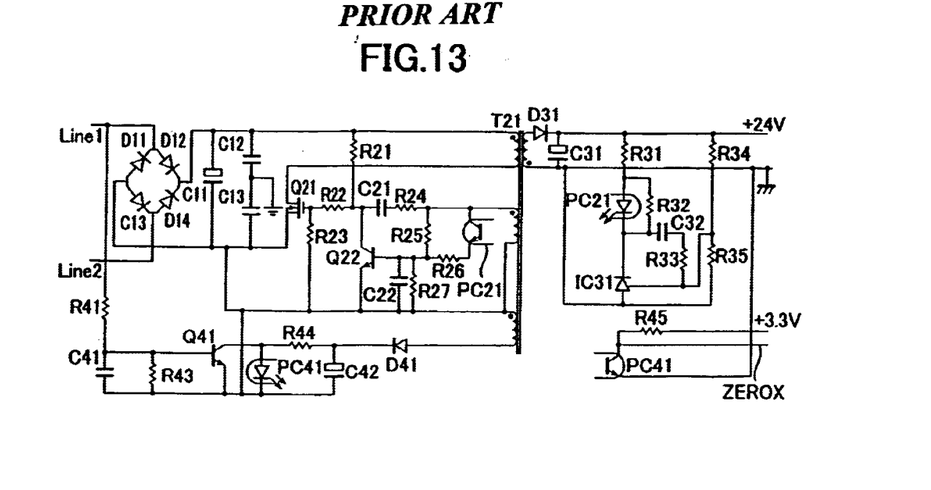
FIG. 13 is a circuit diagram of another zero-cross detection circuit in the related art.

FIG. 13 shows another zero-cross detection circuit in the related art. The zero-cross detection circuits shown in FIGS. 10 and 13 are different from each other in that the zero-cross detection circuit shown in FIG. 13 further includes capacitors C12 and C13. Specifically, in FIG. 13, the capacitors C12 and C13 are connected to the high-voltage output terminal and the low-voltage output terminal of the full-wave rectifying and smoothing circuit, respectively, and the node between the capacitors C12 and C13 is grounded.

In general, for the terminal noise suppression purpose, a capacitor (a so-called Y-capacitor) of approximately several thousand picofarads is connected between a commercial AC power supply line and a ground GND. The capacitors C12 and C13 are Y-capacitors. Although a Y-capacitor may be connected to an input terminal of a full-wave rectifying circuit, it is more effective for the terminal noise suppression purpose to connect a Y-capacitor to an output terminal of a full-wave rectifying circuit. The configuration shown in FIG. 13 is often used.

In the circuit configuration shown in FIG. 13, if Y-capacitors (the capacitors C12 and C13) have a small capacitance or if the commercial AC power supply exhibits a normal waveform, no problem occurs. However, if the Y-capacitors have a large capacitance or if the commercial AC power supply exhibits an undesirable waveform which is not normal, a problem occurs.

Figure 14A:
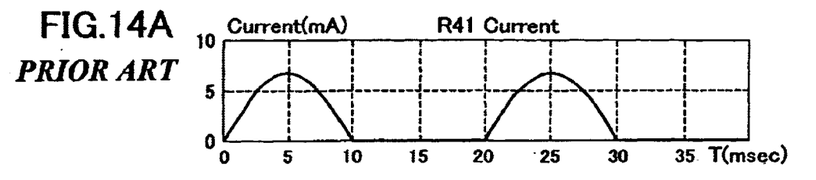
FIGS. 14A to 14C are signal waveforms of components in the zero-cross detection circuit shown in FIG. 13 when Y-capacitors have a relatively small capacitance.
Figure 14B:
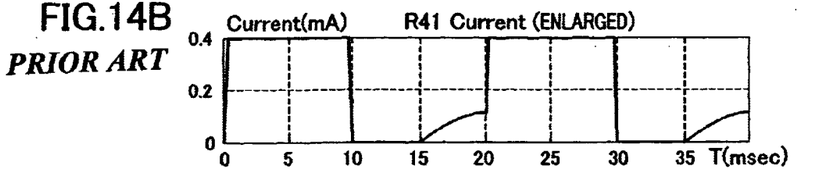
Figure 14C:
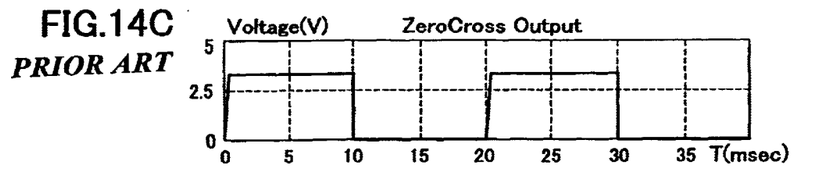

FIGS. 14A to 14C are signal waveforms of the components in the zero-cross detection circuit when the Y-capacitors in the circuit shown in FIG. 13 have a relatively small capacitance. Since the waveforms indicating the potential of the line Line1 with respect to the ground GND, the potential of the line Line2 with respect to the ground GND, and the difference in potential between the lines Line1 and Line2 are the same as those shown in FIGS. 11A to 11C, a description thereof is omitted.

FIG. 14A shows a current flowing in the resistor R41, FIG. 14B shows an enlarged version of the y-axis in FIG. 14A, and FIG. 14C shows the phototransistor collector potential in the secondary of the photocoupler PC41, that is, the zero-cross signal ZEROX.

As is apparent from FIGS. 14A to 14C, if the Y-capacitors have a relatively small capacitance, a zero-cross signal ZEROX can be successfully generated.

Figure 15A:
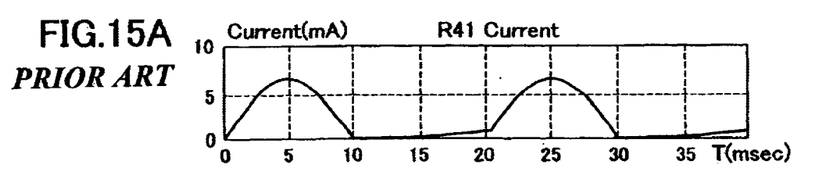
FIGS. 15A to 15C are signal waveforms of the components in the zero-cross detection circuit shown in FIG. 13 when the Y-capacitors have a relatively large capacitance.
Figure 15B:
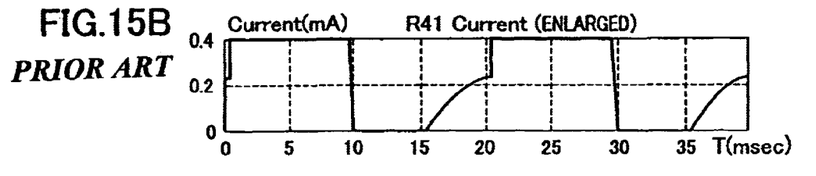
Figure 15C:
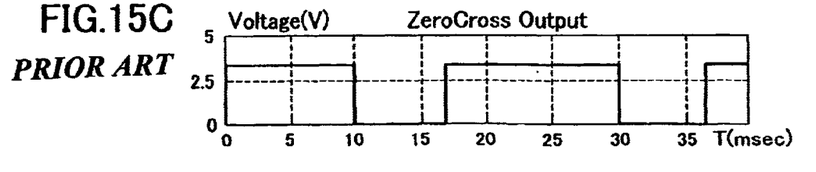

FIGS. 15A to 15C are signal waveforms of the components in the zero-cross detection circuit when the Y-capacitors in the circuit shown in FIG. 13 have a relatively large capacitance. Since the waveforms indicating the potential of the line Line1 with respect to the ground GND, the potential of the line Line2 with respect to the ground GND, and the difference in potential between the lines Line1 and Line2 are the same as those shown in FIGS. 11A to 11C, a description thereof is omitted.

FIG. 15A shows a current flowing in the resistor R41, FIG. 15B shows an enlarged version of the y-axis in FIG. 15A, and FIG. 15C shows the phototransistor collector potential in the secondary of the photocoupler PC41, that is, the zero-cross signal ZEROX.

As is apparent from FIGS. 15A to 15C, if the Y-capacitors have a large capacitance, the zero-cross signal ZEROX shown in FIG. 15C does not indicate a correct zero-cross point.

In FIG. 15B, the current flowing in the resistor R41 rises in a sine-wave fashion at about 15 msec, thus causing a zero-cross point to be unsuccessfully detected.

This current flows in the Y-capacitors C12 and C13 towards the ground GND.

The potential of either the line Line1 or Line2, whichever is lower, is used as the low-voltage output potential of the full-wave rectifying and smoothing circuit with respect to the ground GND. This exhibits a half-wave rectified waveform. The high-voltage output potential of the full-wave rectifying and smoothing circuit with respect to the ground GND is produced by adding the capacitance potential stored in the capacitor C11 to the low-voltage output potential, and, if a DC component is removed, the output would be equal to the half-wave rectified waveform. A current flowing in the Y-capacitors C12 and C13 is therefore produced by differentiating the voltage of the half-wave rectified waveform.

This current flows in the rectifier diodes D11 to D14 when those diodes are conducting, and otherwise flows in the resistor R41. Since the full-wave rectifying and smoothing circuit is capacitor-input, the rectifier diodes D11 to D14 have a small conduction angle and do not conduct most of the time.

Therefore, a current shown as the waveform between about 15 and 20 msec in FIG. 15B flows in the resistor R41.

FIGS. 16A to 16C and 17A to 17C are signal waveforms of the components in the zero-cross detection circuit when the commercial AC power supply on which the third harmonic is superposed exhibits an undesirable waveform in the circuit shown in FIG. 13.

Figure 16A:
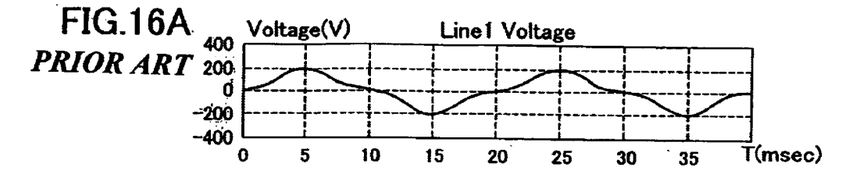
FIGS. 16A to 16C are waveforms of an undesired commercial AC power supply which involves a third harmonic component.
Figure 16B:
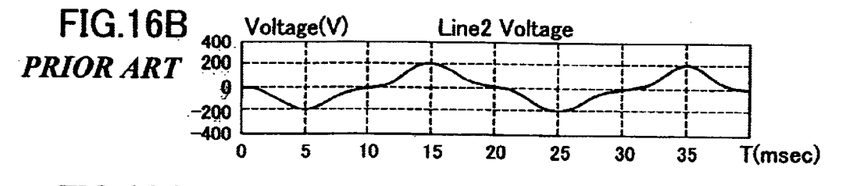
Figure 16C:
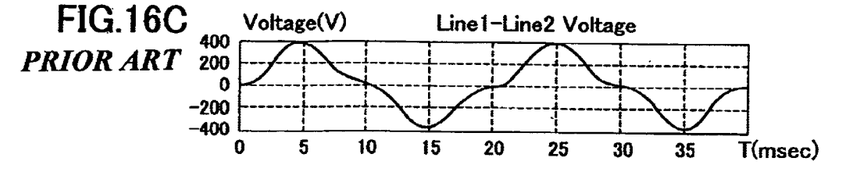
Figure 17A:
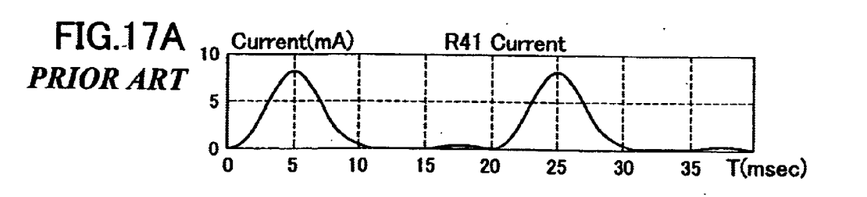
FIGS. 17A to 17C are signal waveforms of the components in the zero-cross detection circuit shown in FIG. 13 when the commercial AC power supply on which the third harmonic is superposed exhibits an undesirable waveform.
Figure 17B:
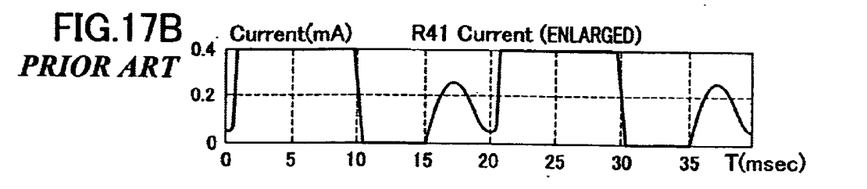
Figure 17C:
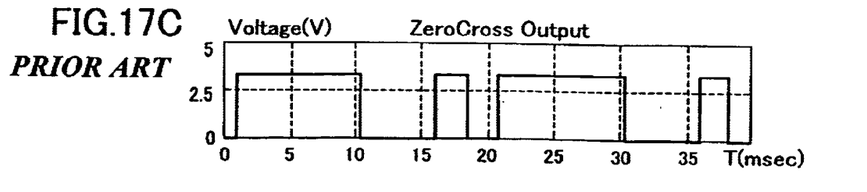

FIG. 16A shows the potential of the line Line1 with respect to the ground GND, FIG. 16B shows the potential of the line Line2 with respect to the ground GND, and FIG. 16C shows the difference in potential between the lines Line1 and Line2. FIG. 17A shows a current flowing in the resistor R41, FIG. 17B shows an enlarged version of the y-axis in FIG. 17A, and FIG. 17C shows the phototransistor collector potential in the secondary of the photocoupler PC41, that is, the zero-cross signal ZEROX.

FIGS. 18A to 18C and 19A to 19C are signal waveforms of the components in the zero-cross detection circuit when the commercial AC power supply which has a 60° phase difference rather than a 180° phase difference exhibits an undesirable waveform in the circuit shown in FIG. 13.

Figure 18A:
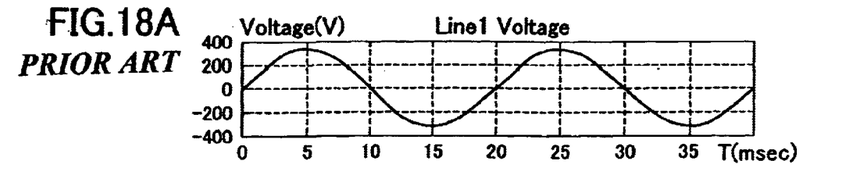
FIGS. 18A to 18C are waveforms of an undesired commercial AC power supply which has a 60° phase difference.
Figure 18B:
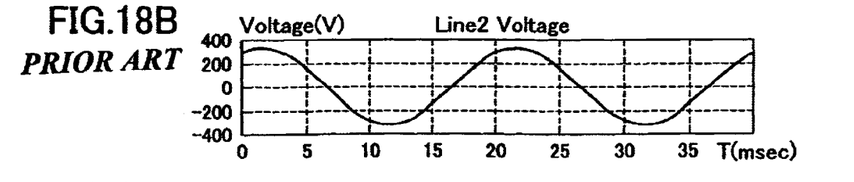
Figure 18C:
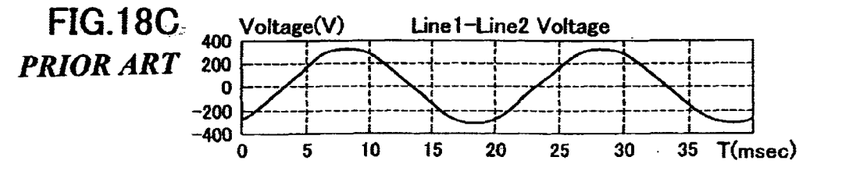
Figure 19A:
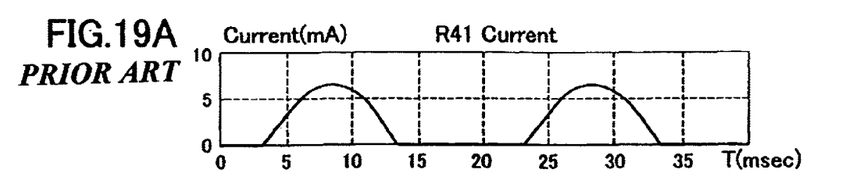
FIGS. 19A to 19C are signal waveforms of the components in the zero-cross detection circuit shown in FIG. 13 when the commercial AC power supply which has a 60° phase difference exhibits an undesirable waveform.
Figure 19B:
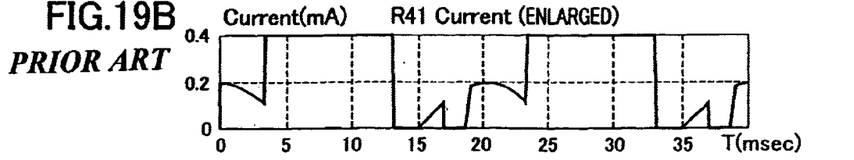
Figure 19C:
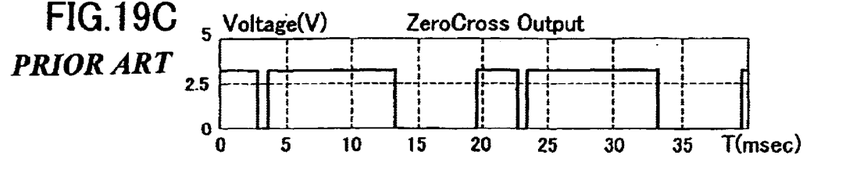

FIG. 18A shows the potential of the line Line1 with respect to the ground GND, FIG. 18B shows the potential of the line Line2 with respect to the ground GND, and FIG. 18C shows the difference in potential between the lines Line1 and Line2. FIG. 19A shows a current flowing in the resistor R41, FIG. 19B shows an enlarged version of the y-axis in FIG. 19A, and FIG. 19C shows the phototransistor collector potential in the secondary of the photocoupler PC41, that is, the zero-cross signal ZEROX.

As is apparent from FIGS. 16A to 19C, if the commercial AC power supply exhibits an undesirable waveform, a correct zero-cross signal ZEROX is not generated.

These phenomena are also caused by a current flowing in the Y-capacitors C12 and C13 towards the ground GND.

If the harmonic is superposed on the commercial AC power supply, the harmonic component is also superposed on the output potential of the full-wave rectifying and smoothing circuit with respect to the ground GND. The harmonic distortion causes a current shown as the waveform between 15 and 20 msec in FIG. 17B to flow in the resistor R41.

If the line Line1 is 180° out of phase with respect to the line Line2 of the commercial AC power supply, the difference in potential between the lines Line1 and Line2 is phase-shifted with respect to the output potential of the full-wave rectifying and smoothing circuit with respect to the ground GND, thus causing a current shown as the waveform between about 15 and 20 msec in FIG. 19B to flow in the resistor R41. In FIG. 19B, the current flowing in the resistor R41 is zero at about 18 msec because the rectifier diodes D11 and D14 are conducting, and the current at this time is supplied to the Y-capacitors C11 and C12 via the diode D14.

SUMMARY OF THE INVENTION

Accordingly, it is an object of the present invention to provide a zero-cross detection circuit of the half-wave rectifier type, which is correctly operated when a Y-capacitor is provided after a full-wave rectifying and smoothing circuit for the terminal noise suppression purpose and which reliably generates a zero-cross signal when a commercial AC power supply exhibits an undesirable waveform.

A zero-cross detection circuit according to the present invention is connected to a power supply device which includes a full-wave rectifying and smoothing circuit, two capacitors, and a switching regulator. The full-wave rectifying and smoothing circuit is powered via first and second lines from a commercial AC power supply for full-wave rectification and smoothing. The two capacitors have first ends connected to high-voltage and low-voltage output terminals of the full-wave rectifying and smoothing circuit, respectively, and second ends connected to a ground. The switching regulator separates and steps down the output from the full-wave rectifying and smoothing circuit to output a desired DC voltage. The zero-cross detection circuit according to the present invention includes a transistor of which the emitter is connected to the low-voltage output terminal of the full-wave rectifying and smoothing circuit for outputting a zero-cross detection signal from the collector; a first resistor connected between the base and emitter of the transistor; a second resistor connected between the first line and the base of the transistor; and a third resistor connected between the second line and the emitter of the transistor.

Preferably, the third resistor has substantially the same resistance as that of the second resistor.

Therefore, the zero-cross detection circuit according to the present invention can be correctly operated when the above-noted Y-capacitors are provided after a full-wave rectifying and smoothing circuit for the terminal noise suppression purpose. Furthermore, if the commercial AC power supply exhibits an undesirable waveform, the zero-cross detection circuit can reliably generate a zero-cross signal.

Preferably, the zero-cross detection circuit includes a diode connected between the base and emitter of the transistor in such a manner that the anode of the diode is connected to the emitter of the transistor.

Also, a diode may be connected between the first line and the second resistor in such a manner that the anode of the diode is connected to the first line. The second resistor and the diode may be replaced.

This arrangement prevents a reverse bias from being applied between the base and emitter of the transistor if noise is present in the commercial AC power supply. Additionally, another diode may be connected between the second line and the third resistor in such a manner that the anode of the second diode is connected to the second line.

Further objects, features and advantages of the present invention will become apparent from the following description of the preferred embodiments with reference to the attached drawings.

DESCRIPTION OF THE PREFERRED EMBODIMENTS

Embodiments of the present invention are described below with reference to the drawings.

First Embodiment

Figure 1:
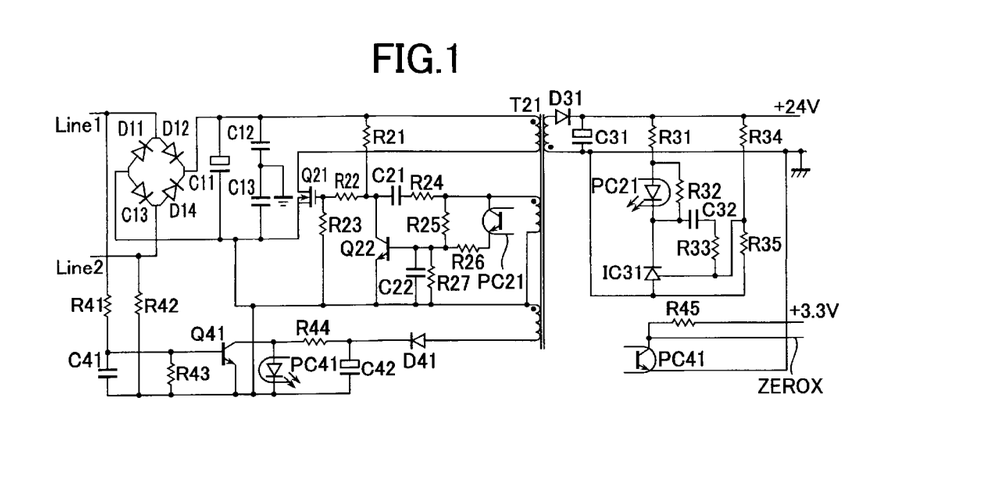
FIG. 1 is a circuit diagram of a power supply device using a commercial AC power supply, showing a zero-cross circuit according to a first embodiment of the present invention, and a rectifying and smoothing circuit and a switching regulator which are connected to the zero-cross detection circuit.

FIG. 1 is a circuit diagram of a power supply device including a zero-cross detection circuit according to a first embodiment of the present invention.

In FIG. 13, the same reference numerals are given to substantially the same components in FIG. 1.

In FIG. 1, the power supply device includes a zero-cross detection circuit, a rectifying and smoothing circuit, and a switching regulator, as in the circuit configuration shown in FIG. 13. The switching regulator of the self-excitation type is formed of components indicated by Q21, Q22, C21, C22, C31, C32, D31, IC31, R21 to R27, R31 to R35, and PC21. The zero-cross detection circuit is formed of components indicated by Q41, C41, C42, D41, R41 to R45, and PC41. The switching regulator includes a transformer T21 for separating and stepping down the DC output from the full-wave rectifying and smoothing circuit to output a desired DC voltage. Although the switching regulator in the power supply device shown in FIG. 1 is implemented as a self-excitation type flyback converter, the zero-cross detection circuit has the same configuration regardless of the type of the switching regulator.

The zero-cross detection circuit according to the present invention is different from that shown in FIG. 13 in that a resistor R42 is connected between the line Line2 and the low-voltage output terminal of the full-wave rectifying and smoothing circuit, i.e., the emitter of the transistor Q41.

When the potential of the line Line2 is higher than the potential of the line Line1, the resistor R42 allows a current to flow, and therefore allows a current flowing in the Y-capacitors (capacitors C12 and C13) to flow to the resistor R42. This hinders an unwanted current caused by the Y-capacitors from flowing to the resistor R41. Therefore, when the Y-capacitors have a large capacitance or when the commercial AC power supply exhibits an undesirable waveform, a zero-cross signal can be reliably generated.

The resistor R42 is provided in a circuit portion which is an input to the zero-cross detection circuit from the line Line2. This allows an unwanted current caused by the Y-capacitors to bypass the zero-cross detection circuit, thereby reliably generating a zero-cross signal in the zero-cross detection circuit.

Preferably, the resistors R41 and R42 have substantially the same resistance in view of the following two points:

1. Desirably, the impedances with respect to the ground GND are a match between the line Line1 and the line Line2 because common-mode noise caused in the lines Line1 and Line2, which is impulse noise, would be prevented from diverting into normal-mode noise due to a lack of impedance matching, thereby less possibly reducing the property of the lines Line1 and Line2 which is resistant to the common-mode noise; and 2. Noise radiation due to a lack of impedance matching between the lines Line1 and Line2 with respect to the output terminal of the full-wave rectifying and smoothing circuit would increase.

Reliable generation of a zero-cross signal in the zero-cross detection circuit is described with reference to FIGS. 2A to 7C, taken in conjunction with an example.

FIGS. 2A to 2C and 3A to 3C are signal waveforms of the components in the zero-cross detection circuit shown in FIG. 1 when the Y-capacitors have a large capacitance.

Figure 2A:
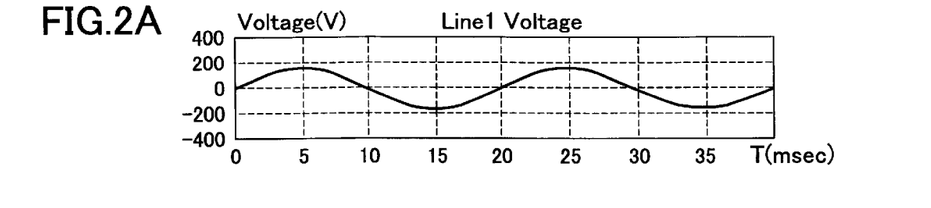
FIGS. 2A to 2C are waveforms of a normal commercial AC power supply.
Figure 2B:
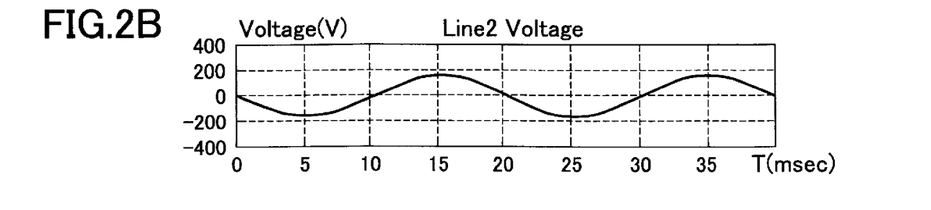
Figure 2C:
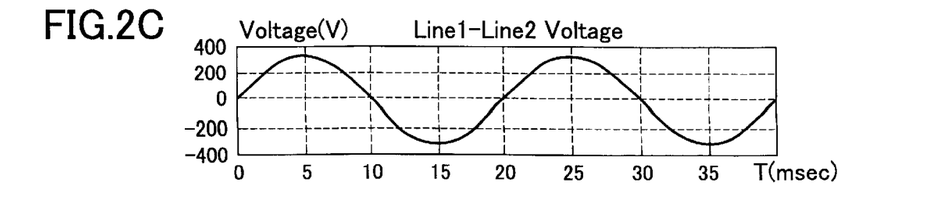
Figure 3A:
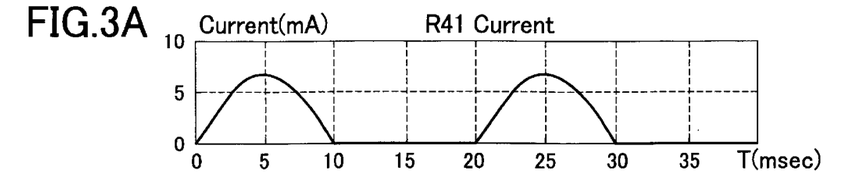
FIGS. 3A to 3C are signal waveforms of the components in the zero-cross detection circuit shown in FIG. 1 when the Y-capacitors have a large capacitance.
Figure 3B:
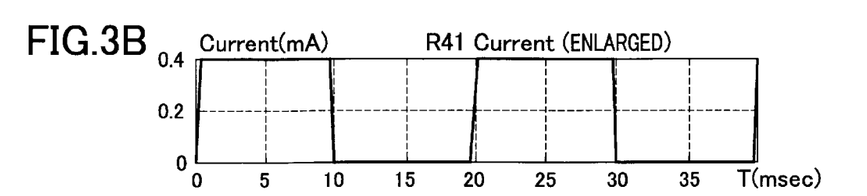
Figure 3C:
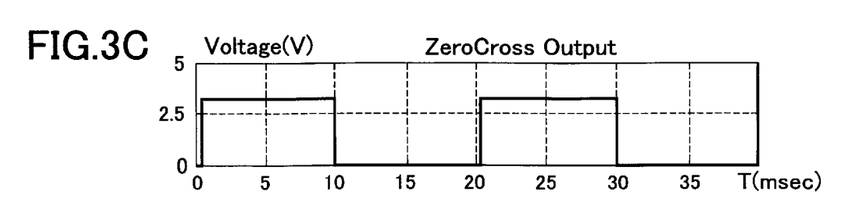
Figure 4A:
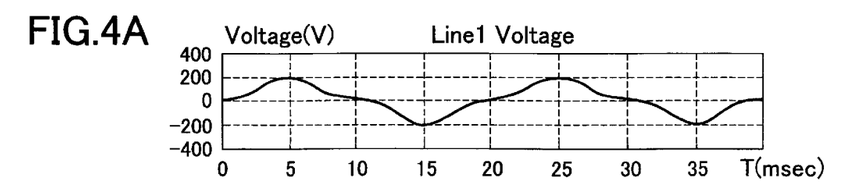
FIGS. 4A to 4C are waveforms of an undesired commercial AC power supply which involves a third harmonic component.
Figure 4B:
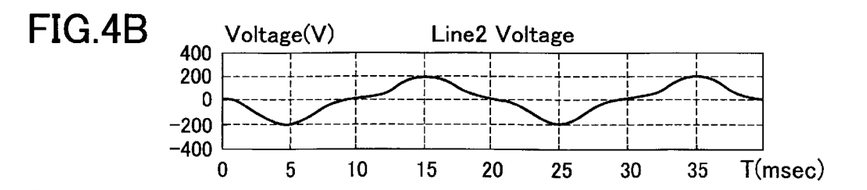
Figure 4C:
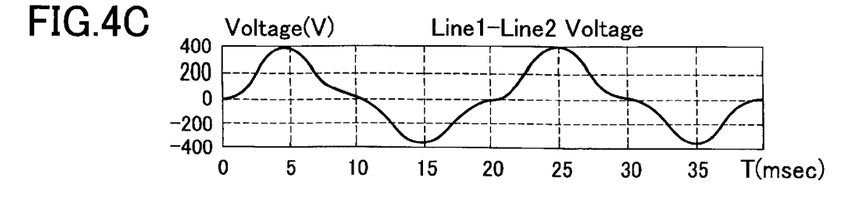

In FIGS. 2A to 2C and 3A to 3C, the x-axis represents time. FIG. 2A shows the potential of the line Line1 with respect to a ground GND, FIG. 2B shows the potential of the line Line2 with respect to the ground GND, and FIG. 2C shows the difference in potential between the lines Line1 and Line2. FIG. 3A shows a current flowing in the resistor R41, FIG. 3B shows an enlarged version of the y-axis in FIG. 3A, and FIG. 3C shows the phototransistor collector potential in the secondary of the photocoupler PC41, that is, the zero-cross signal ZEROX.

FIGS. 4A to 4C and 5A to 5C are signal waveforms of the components in the zero-cross detection circuit shown in FIG. 1 when the third harmonic is superposed on the commercial AC power supply.

FIGS. 6A to 6C and 7A to 7C are signal waveforms of the components in the zero-cross detection circuit shown in FIG. 1 when the commercial AC power supply has a 60° phase difference.

Figure 5A:
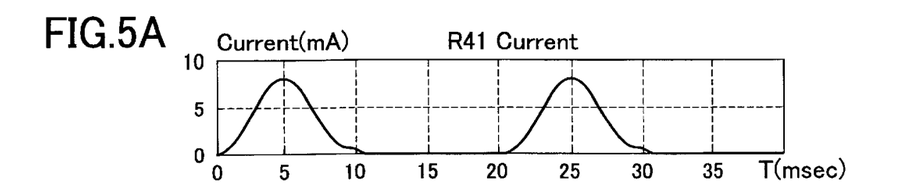
FIGS. 5A to 5C are signal waveforms of the components in the zero-cross detection circuit shown in FIG. 1 when the third harmonic is superposed on the commercial AC power supply.
Figure 5B:
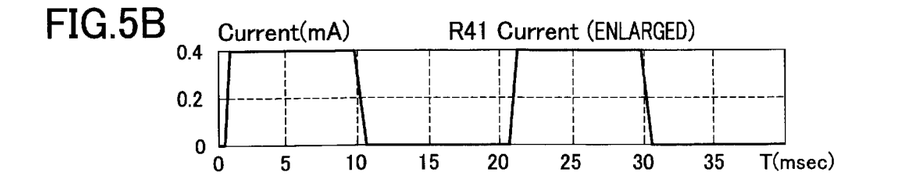
Figure 5C:
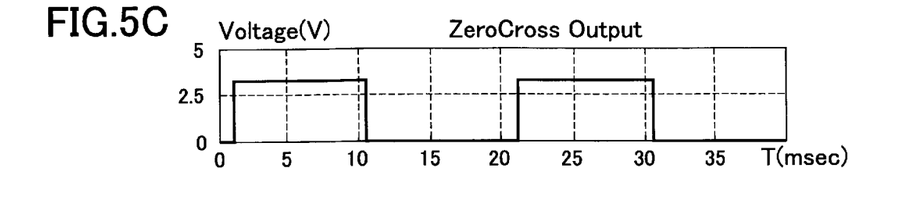
Figure 6A:
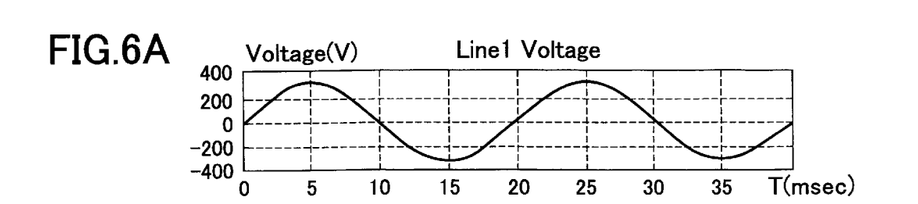
FIGS. 6A to 6C are waveforms of an undesired commercial AC power supply which has a 60° phase difference.
Figure 6B:
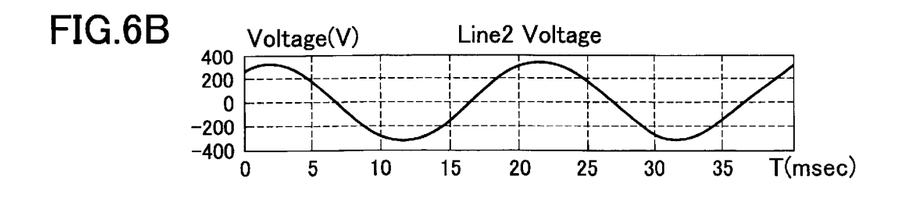
Figure 6C:
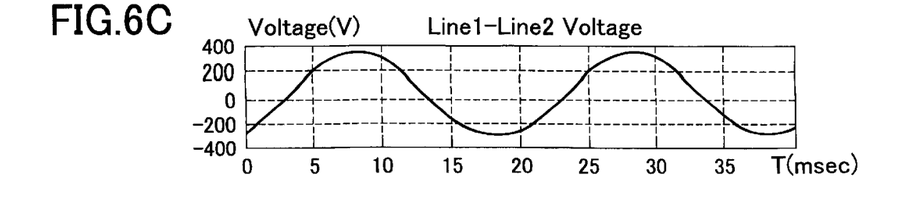
Figure 7A:
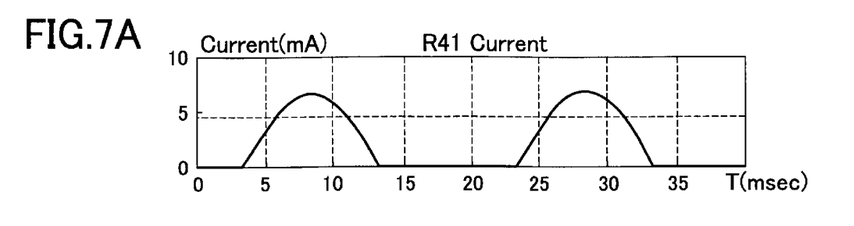
FIGS. 7A to 7C are signal waveforms of the components in the zero-cross detection circuit shown in FIG. 1 when the commercial AC power supply has a 60° phase difference.
Figure 7B:
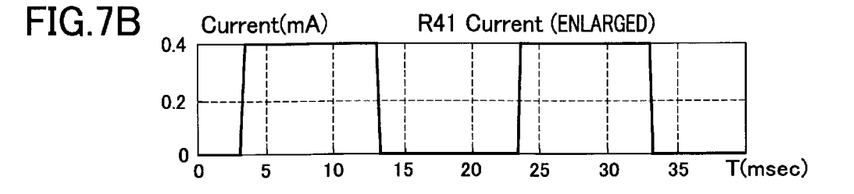
Figure 7C:
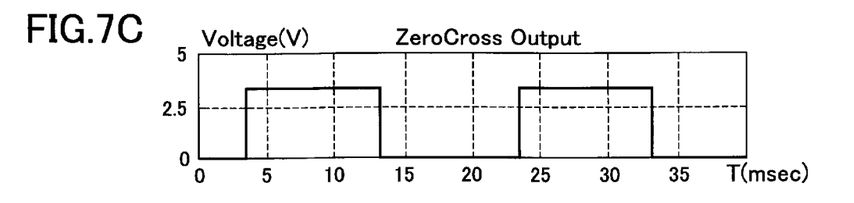

As is apparent from FIGS. 3B, 5B, and 7B, a current flowing in the resistor R41 does not exhibit an undesirable waveform, thus allowing a correct zero-cross signal ZEROX to be generated, as shown in FIGS. 3C, 5C, and 7C.

Second Embodiment

Figure 8:
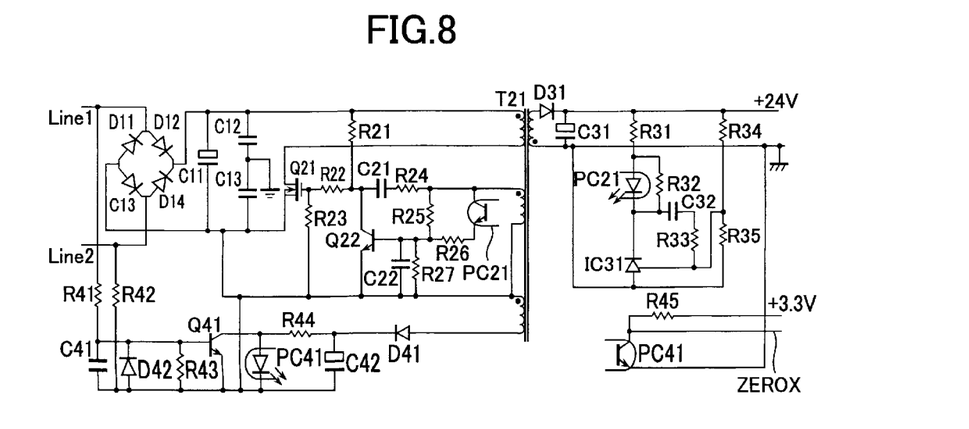
FIG. 8 is a circuit diagram of a power supply device including a zero-cross detection circuit according to a second embodiment of the present invention.

FIG. 8 is a circuit diagram of a power supply device including a zero-cross detection circuit according to a second embodiment of the present invention. The second embodiment has substantially the same basic structure as the first embodiment, but includes a diode D42 connected between the base and emitter of the transistor Q41 in such a manner that the anode of the diode D42 is connected to the emitter of the transistor Q41.

The diode D42 prevents a reverse bias from being applied between the base and emitter of the transistor Q41 if noise is present in the commercial AC power supply.

Third Embodiment

Figure 9:
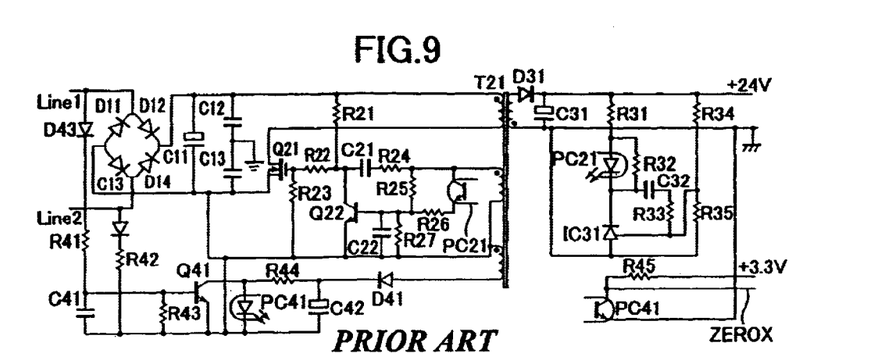
FIG. 9 is a circuit diagram of a power supply device including a zero-cross detection circuit according to a third embodiment of the present invention.

FIG. 9 is a circuit diagram of a power supply device including a zero-cross detection circuit according to a third embodiment of the present invention. The third embodiment has substantially the same basic structure as the first embodiment, but includes a diode D43 connected in series with the resistor R41 in such a manner that the anode of the diode D43 is connected to the line Line1.

As in the second embodiment, the diode D43 also prevents a reverse bias from being applied between the base and emitter of the transistor Q41 if noise is caused in the commercial AC power supply.

In the circuit shown in FIG. 9, a diode which is the same as the diode D43 may be further connected between the line Line2 and the resistor R42 in such a manner that the anode of the additional diode is connected to the line Line2, thus making the resistors R41 and R42 symmetric.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A zero-cross detection circuit connected to a power supply device, the power supply device including:
    a full-wave rectifying and smoothing circuit powered via first and second lines from a commercial AC power supply for full-wave rectification and smoothing;
    two capacitors having first ends connected to a high-voltage output terminal and a low-voltage output terminal of the full-wave rectifying and smoothing circuit, respectively, and second ends connected to a ground; and
    a switching regulator for separating and stepping down the output from the full-wave rectifying and smoothing circuit to output a desired DC voltage,
    said zero-cross detection circuit comprising:
        a transistor, having an emitter, a base, and a collector, of which the emitter is connected to the low-voltage output terminal of the full-wave rectifying and smoothing circuit for outputting a zero-cross detection signal from the collector;
        a first resistor connected between the base and emitter of the transistor;
        a second resistor connected between the first line and the base of the transistor; and
        a third resistor connected between the second line and the emitter of the transistor.

2. A zero-cross detection circuit according to claim 1, wherein the third resistor has substantially the same resistance as that of the second resistor.

3. A zero-cross detection circuit according to claim 1, further comprising a diode, having an anode and a cathode, connected between the base and emitter of the transistor in such a manner that the anode of the diode is connected to the emitter of the transistor.

4. A zero-cross detection circuit according to claim 1, further comprising a diode, having an anode and a cathode, connected in series with the second resistor in such a manner that the anode of the diode is connected closer to the first line than to the transistor.

5. A zero-cross detection circuit according to claim 4, further comprising a second diode, having an anode and a cathode, connected in series with the third resistor in such a manner that the anode of the second diode is connected closer to the second line than to the transistor.

6. A zero-cross detection circuit according to claim 1, wherein the transistor is an n-p-n transistor.

* * * * *